United States Patent
Grau et al.

(10) Patent No.: US 10,689,750 B2
(45) Date of Patent: Jun. 23, 2020

(54) EVAPORATOR BODY WITH TITANIUM HYDRIDE COATING, METHOD FOR THE PRODUCTION AND USAGE THEREOF

(71) Applicant: Kennametal Inc., Latrobe, PA (US)

(72) Inventors: Rudolf Karl Grau, Neustadt an der Aisch (DE); Rodrigue Ngoumeni Yappi, Füssen (DE); Hubert Josef Schweiger, Füssen (DE)

(73) Assignee: KENNAMETAL INC., Latrobe, PA (US)

( * ) Notice: Subject to any disclaimer, the term of this patent is extended or adjusted under 35 U.S.C. 154(b) by 366 days.

(21) Appl. No.: 15/215,170

(22) Filed: Jul. 20, 2016

(65) Prior Publication Data

US 2017/0022600 A1 Jan. 26, 2017

(30) Foreign Application Priority Data

Jul. 24, 2015 (DE) .......................... 10 2015 112 135

(51) Int. Cl.
  *C23C 14/24* (2006.01)
  *C23C 14/14* (2006.01)
(52) U.S. Cl.
  CPC ............ *C23C 14/243* (2013.01); *C23C 14/14* (2013.01)
(58) Field of Classification Search
  CPC .......... C23C 14/06; C23C 14/24; C23C 24/08
  See application file for complete search history.

(56) References Cited

U.S. PATENT DOCUMENTS

| | | | |
|---|---|---|---|
| 2,756,166 A | 7/1956 | Alexander et al. | |
| 2,776,472 A * | 1/1957 | Mesick | C04B 37/006 228/124.6 |
| 2,897,394 A * | 7/1959 | Marsden, Jr. | H01J 21/36 313/245 |
| 3,730,507 A * | 5/1973 | Montgomery | C04B 35/583 266/275 |
| 4,810,531 A * | 3/1989 | Heyes | C23C 14/243 427/236 |
| 6,645,572 B2 | 11/2003 | Seifert | |
| 2009/0129762 A1* | 5/2009 | Goetz | C23C 14/20 392/387 |
| 2009/0217876 A1 | 9/2009 | Epstein | |

FOREIGN PATENT DOCUMENTS

| | | |
|---|---|---|
| DE | 102004009335 A1 | 9/2005 |
| DE | 102005030862 B4 | 12/2009 |
| DE | 102013218322 A1 | 3/2015 |
| WO | 2006117119 A1 | 11/2006 |

OTHER PUBLICATIONS

Dec. 18, 2015 Official Action.

* cited by examiner

*Primary Examiner* — Nathan H Empie
(74) *Attorney, Agent, or Firm* — Larry R. Meenan

(57) ABSTRACT

An evaporator body for a PVD coating system comprises a basic body and an evaporator surface, to which a titanium dihydride layer is applied. A titanium hydride layer comprises an organic carrier agent and titanium hydride as the single inorganic solid. The thickness of the layer is less than or equal to 10 μm.

13 Claims, 1 Drawing Sheet

EVAPORATOR BODY WITH TITANIUM HYDRIDE COATING, METHOD FOR THE PRODUCTION AND USAGE THEREOF

RELATED APPLICATION DATA

The present application claims priority pursuant to 35 U.S.C. § 119(a) to German Patent Application Number 102015112135.2 filed Jul. 24, 2015 which is incorporated herein by reference in its entirety.

FIELD

The invention relates to an evaporator body for a PVD coating system having a basic body, which has an evaporator surface. The invention further relates to a method for producing such type of evaporator body for a PVD coating system as well as the use of the evaporator body for the metallization of substrates with aluminum.

BACKGROUND

Evaporator bodies for PVD coating systems and methods for the production thereof are known, for example, from DE 10 2005 030 862 B4, to which reference is made.

The evaporator bodies can be used in vacuum metallization systems, in which a metal is deposited onto a substrate by means of PVD (physical vapor deposition) technology. The metallization systems are used particularly to coat flexible substrates with metals, particularly with aluminum. Films, particularly plastic films, may be used as substrates. The coating material is continuously fed to the heated evaporator body and evaporates on an evaporator surface of the evaporator body in a vacuum.

The evaporator body is preferably a ceramic body, which contains titanium boride and boron nitride as the main components and which can be adjusted to a specific electrical resistance of, for example, 600 to 6000 $\mu\Omega$ cm through a suitable mixture of these materials. The evaporator body contains the components titanium boride and boron nitride typically in about equal portions of about 50% by weight each, plus/minus about 5% by weight. The heating of the evaporator body typically takes place by applying a heating current.

For continuous coating with the highest possible processing speed, the adjusting of the evaporation parameters is of decisive significance. It is especially important that the evaporator surface of the evaporator body be as homogenous as possible and be completely wetted with the material to be evaporated, particularly aluminum.

Various measures are already known from the prior art for improving the wetting of the evaporator surface.

DE 10 2005 030 862 B4 discloses the use of a first-wetting auxiliary material, which is applied to the evaporator surface before the initial use of the evaporator body in a coating system. The first-wetting auxiliary material may be applied or even painted on as a paste or as a suspension. It contains powdery aluminum as well as additional powdery wetting agents. When heated, the aluminum combines with the boron nitride of the evaporator body to form aluminum nitride, which exhibits improved wetting behavior for aluminum in comparison with boron nitride. By applying the first-wetting auxiliary material, a wetting coat is thus formed by reacting the aluminum with the boron nitride. The further powdery wetting agents are, for example, titanium, titanium diboride, zirconium, zirconium diboride, molybdenum, or even metal alloys. These further powdery wetting agents facilitate a maximum widespread distribution of the aluminum that melts when the evaporator body is heated. In addition to creating a wetting layer made of aluminum nitride, the particular advantage is thus also achieved that the evaporator surface is homogenously wetted with the then liquid aluminum right at the start of the evaporation process due to the integration of the aluminum into the first-wetting auxiliary material.

US 2009/0217876 A1 discloses a coating system for extending the service life of a ceramic evaporation boat. The coating system comprises a ceramic layer on the surface of the evaporation boat. Optionally, a heat-resistant metallic layer is applied between the surface of the evaporation boat and the ceramic layer. The ceramic material of the ceramic layer is selected from metal borides, metal nitrides, metal carbides, metal oxides, and combinations thereof, wherein the metal component of the ceramic material is selected from zirconium, aluminum, titanium, silicon, tantalum, vanadium, and combinations thereof. The coating thickness of the ceramic layer is preferably between 1.5 and 5 $\mu$m.

WO 2006/117119 A1 describes an evaporation boat comprising an electrically conductive ceramic carrier material for the evaporation of substrates with metals, wherein on the surface of the evaporation boat from which the evaporation of the metals takes place, one of the following coatings is provided: a) a coating of at least one boride of a transitional metal from Group 4 to 6 of the Periodic Table, b) a coating from a mixture of the metal to be evaporated and at least one transitional metal from Group 4 to 6 of the Periodic Table and/or the borides thereof, c) a first coating from at least one transitional metal from Group 4 to 6 of the Periodic Table and/or the borides thereof and a coating applied thereto comprising a metal to be evaporated. The evaporation boats should exhibit good initial wetting for the metals to be evaporated such that the evaporation can be implemented with minimal spatter and uniformly.

U.S. Pat. No. 6,645,572 B2 and DE 10 2004 009 335 A1 relate to metal and evaporation boats comprising a ceramic material for saving electric power during evaporation comprising an electrically conductive component and an electrically non-conductive component, wherein the electrically conductive component of the ceramic material is enriched on the contact surface of the evaporation boat.

U.S. Pat. No. 4,810,531 discloses a method for the chemical vapor deposition of tin, in which an evaporator body comprising boron nitride is provided with an evaporation layer, to which a dispersion containing titanium hydride is applied. The titanium dihydride in this case is dispersed in a chlorinated organic solvent, preferably carbon tetrachloride. As the evaporator body is heated, the solvent evaporates and a titanium hydride layer remains as a wetting layer, which is intended to improve the wetting behavior for tin as the material to be evaporated. The thickness of the titanium hydride layer is about 0.1 mm.

U.S. Pat. No. 2,756,166 discloses a further PVD coating system, in which coated carbon rods are used as the evaporation bodies. The carbon rods are equipped with a suspension containing titanium hydride, wherein the titanium hydride decomposes into metallic titanium and hydrogen gas when heated. The metallic titanium then reacts in turn with carbon from the carbon rods used to form titanium carbide in order to thus form a wetting layer.

DE 10 2013 218 322 A1 describes an evaporator body for a PVD coating system, which comprises a basic body with an evaporator surface, to which an aluminum titanium wetting layer is applied. Upon delivery, a layer containing two reactants, particularly aluminum and titanium dihydride, is applied to the basic body. When the basic body is heated to about 1500° C., the two reactants form the wetting layer. The layer with the two reactants is applied from a suspension to the evaporator body, which has a thickness of about 0.1 to 0.2 mm.

SUMMARY

On this basis, the object of the invention is to provide an economical evaporator body with simultaneously excellent wetting behavior for aluminum.

The object is accomplished according to the invention by an evaporator body having the features of claim 1, as well as by a method with the features of claim 5.

According to a first aspect of the invention, the evaporator body is adapted for use in a PVD coating system and comprises a basic body having an evaporator surface on the basic body, to which the metal to be evaporated, particularly aluminum, is applied during operation. A provision according to the invention is that a titanium hydride layer that contains an organic carrier agent and titanium hydride as the single inorganic solid be applied to the evaporator surface. The thickness of the titanium hydride layer is a maximum of 10 µm according to the invention.

A further aspect of the invention is a method for producing an evaporator body for a PVD coating system with a basic body and an evaporator surface on the basic body, which comprises the following steps: Providing a suspension of titanium hydride and an organic carrier agent in an organic solvent; and applying the suspension onto the evaporator surface while forming a titanium hydride layer, in which titanium hydride is present as the single inorganic solid, wherein the titanium hydride layer is formed in a thickness of no more than 10 µm.

A further aspect of the invention relates to the use of the evaporator body for the metallization of a substrate with aluminum through physical vapor deposition from the gas phase (PVD).

Surprisingly, an evaporator body with such a thin titanium hydride layer forms, with the application of heat in the presence of aluminum, a wetting layer having the same excellent wetting behavior and enabling the same lengths of service life as the several-times-thicker layers of the prior art. Thus, the consumption of material can be significantly reduced during the production of the evaporator body. In addition, it is advantageous that multicomponent coatings can be dispensed with. The suspensions for coating the evaporator body can thus be produced more simply and are easier to handle.

The basic body is preferably a hot-pressed ceramic basic body comprising the main components titanium diboride and boron nitride. The components titanium diboride and boron nitride are preferably present in portions each of about 40 to 60% by weight, or preferably in portions of about 45 to 55% by weight. Preferably, the basic body has a specific electrical resistance ranging from 600 to 6000 µΩ cm.

The evaporator surface is preferably a cavity for accommodating melted metal, which is placed into a surface of the basic body.

A titanium hydride layer is placed onto the evaporator surface according to the invention. The term titanium hydride in this description characterizes "titanium dihydride" in a stoichiometric and substoichiometric composition.

When the basic body is heated in the presence of aluminum during the first commissioning of the evaporator body, the titanium hydride layer forms a permanent wetting layer.

The inventors assume that the titanium hydride will be converted with the aluminum applied to the evaporator surface during first commissioning with the formation of titanium aluminide $TiAl_3$ and other $Ti_xAl_y$ phases. In addition, the titanium hydride can also react, when the basic body is heated to a temperature greater than about 1000° C., with the boron nitride of the basic body while forming an intermediate layer comprising titanium diboride and titanium nitride. The intermediate layer may facilitate the adherence of the wetting layer on the evaporator surface.

According to the invention, it is thus sufficient for the titanium hydride layer applied to the evaporator surface to contain the titanium hydride as the single inorganic solid.

The aluminum used to form the wetting layer does not necessarily have to be applied to the evaporator surface during the production of the evaporator body. Instead, the formation of the wetting layer can take place during initial commissioning, during which the aluminum can be easily added to the evaporator surface and the evaporator body can be heated to a temperature greater than about 1000° C.

The formation of the wetting layer can preferably take place during commissioning by the user of the PVD coating system.

All other components of the titanium hydride layer are organic components. According to the invention, the titanium hydride layer comprises an organic carrier agent. The organic carrier agent preferably comprises a synthetic resin, especially preferably a physically drying synthetic resin. Especially preferably, the organic carrier material is a synthetic resin on the basis of chlorinated rubber, polyvinyl chloride (PVC), vinyl polymers, styrene butadiene copolymers, and silicones, or mixtures thereof. More preferably, the organic carrier agent is a PVC synthetic resin.

The titanium hydride in the titanium hydride layer is preferably dispersed in a matrix comprising the organic carrier agent. Especially preferably, the titanium hydride is present as a powder, wherein the powder particles of the titanium hydride can preferably have a granule size of <0.04 mm.

According to a preferred embodiment, the thickness of the titanium hydride layer is about 2 to 8 µm, or especially preferably about 4 to about 6 µm, or very especially preferably about 5 µm.

In order to produce the evaporator body, a suspension of titanium hydride and the organic carrier agent is provided and applied to the evaporator surface of the evaporator body while forming the titanium hydride layer. Preferably, the titanium hydride is suspended in a varnish in which the organic carrier agent is present as a binding agent. Especially preferably, the organic carrier agent is a synthetic resin, and the varnish is a physically drying varnish.

Various options are available for applying the titanium hydride layer. For example, the titanium hydride suspension can be applied onto the evaporator surface by rolling, spraying, or printing.

The application of the suspension comprising titanium hydride and the organic carrier agent preferably takes place by means of a printing process, or particularly preferably by means of pad printing. In the pad printing process, a homogenous coating of the evaporator surface is possible.

The portion of titanium hydride in the suspension is preferably in a range of from 5 to 15% by weight in relation to the total weight of the suspension. Especially preferably, the titanium hydride portion in the suspension is in a range of about 8 to 12% by weight, and very especially preferably about 10% by weight.

The coating weight of the suspension is preferably between 1 and 5 mg/cm$^2$, or with preference between 1 and 3 mg/cm$^2$, or more preferably between about 2.1 and 2.5 mg/cm$^2$, and even more preferably about 2.3 mg/cm$^2$.

These parameters ensure a sufficiently homogenous formation of the titanium hydride layer and simultaneously the formation of a sufficiently homogeneous wetting layer.

The suspension may contain one or more organic solvents as the solvent. Preferably, the solvents are selected from the group of aliphatic ketones, esters, and ethers, the mineral oils, and aromatic hydrocarbons. The solvents facilitate the dispersion of the preferably powdery titanium hydride in the organic carrier agent.

After the application of the suspension onto the evaporator surface, the solvents preferably evaporate at ambient temperature. The organic carrier agent remains on the evaporator surface as a polymer film together with the titanium hydride dispersed therein while forming the titanium hydride layer.

The organic carrier agent thus ensures good adherence of the titanium hydride layer on the evaporator surface. According to the invention, the titanium hydride layer has a thickness of no more than 10 μm, or preferably of from 2 to 8 μm, and especially preferably of about 5 μm. The titanium hydride is the single inorganic solid in the titanium hydride layer.

When the evaporator body coated with the titanium hydride layer is heated to a temperature greater than 1000° C., the organic carrier agent evaporates or decomposes, and the titanium hydride remains behind, which can partially react with boron nitride from the basic body with the formation of an intermediate layer comprising titanium diboride and titanium nitride.

In the presence of aluminum, the titanium hydride can further be converted with the formation of a wetting layer, which contains the Ti$_x$Al$_y$ titanium aluminide phases, or preferably TiAl$_3$.

The wetting layer is preferably generated during first commissioning, i.e. during first-time use of the evaporator body in a metallization system. The evaporator body with the titanium hydride layer is provided by the manufacturer and delivered to the customer. During operation in the metallization system, the evaporator body is typically heated to a temperature greater than 1000° C., or preferably heated to 1400 to 1700° C. Before the evaporator body has reached its final temperature, the organic carrier agent is already evaporated or decomposed, and the titanium hydride has already partially reacted with the boron nitride of the basic body with the formation of the intermediate layer. The conversion of the titanium hydride layer with the aluminum added for the evaporation then leads to the formation of the wetting layer. The evaporator body can thus be continuously heated without the interim cooling. The wetting layer is sufficiently stable despite the slight thickness of the titanium hydride layer and has the necessary service life over multiple application cycles of the evaporator body in the metallization system.

BRIEF DESCRIPTION OF THE DRAWINGS

Further features and advantages of the invention are derived from the following description of one non-limiting embodiment with reference to the attached drawing. The drawing shows the following.

DETAILED DESCRIPTION

Figure 1:
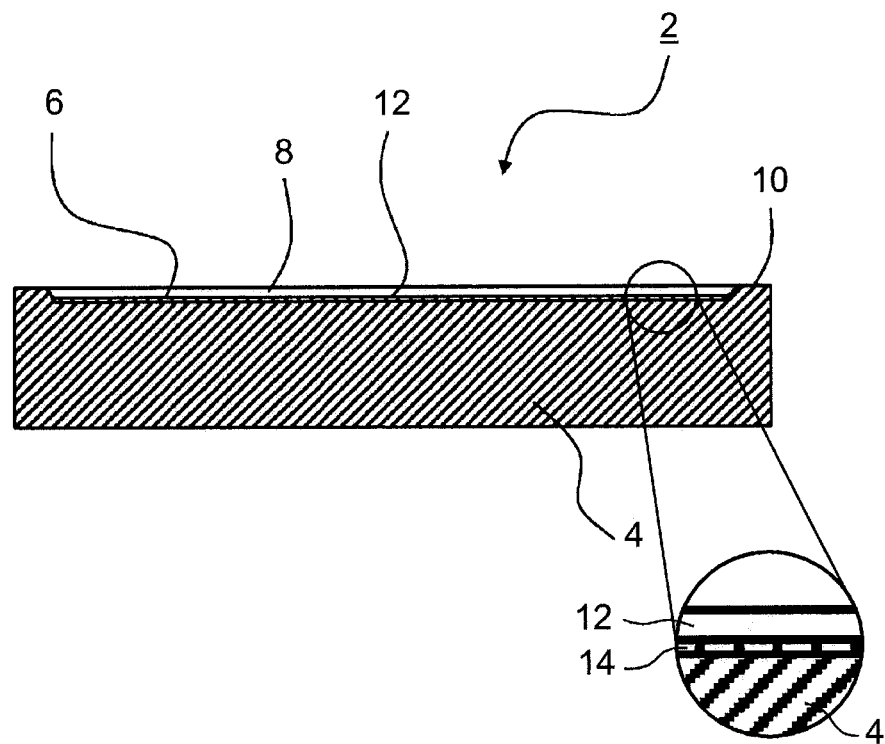
FIG. 1 shows the schematic representation of an evaporator body of a PVD coating system in a cross-section.

The evaporator body 2 shown in FIG. 1 has a basic body 4, which is formed as a hot-pressed ceramic body with the main components boron nitride and titanium diboride as the electrically conductive component. The basic body 4 has a specific electrical resistance ranging from 600 to 6000 μΩ cm. The portion of each of the two components in this case is about 50% by weight.

The evaporator body 2 typically has a length of about 130 mm, a width of about 30 mm, and a height of about 10 mm. On its upper side, the evaporator body 2 has an evaporator surface 6, which, in the exemplary embodiment, is formed by a cavity 8 placed in the surface. The cavity 8 in this case is defined by a circumferential edge 10.

The base of the cavity 8 is equipped with a wetting layer 12, which is formed as a titanium/aluminum layer. An intermediate layer 14 comprising titanium diboride and titanium nitride may be formed at a boundary surface between the wetting layer 12 and the basic body 4.

During operation in a PVD coating system, aluminum is added to the evaporator surface 6, for example as a rod or wire, and melts there such that the molten aluminum is then distributed over a large surface of the evaporator surface 6 and wets it. A good wetting behavior is then achieved by the wetting layer 12. The evaporator body 2 is heated by an electrical current typically to 1400 to 1700° C., which is introduced through the evaporator body 2. The molten aluminum evaporates under a vacuum and coats a substrate, which is not shown in more detail here.

Figure 2:
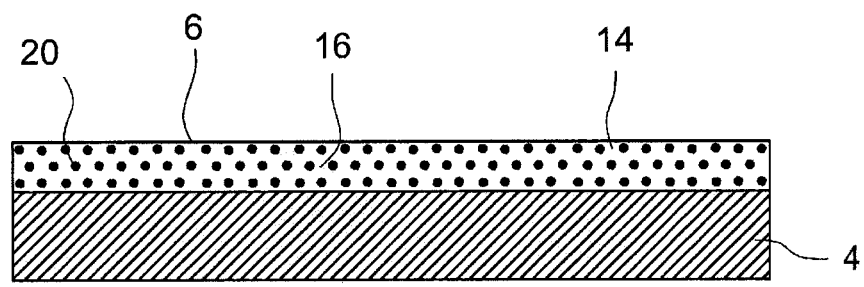
FIG. 2 shows a schematic representation of a partial view of the evaporator body in a cross-section.

FIG. 2 shows a cutout of the evaporator body 2 according to the invention in the starting state, before delivery to the customer.

A titanium hydride layer 16 is placed onto the evaporator surface 6. The titanium hydride layer 16 comprises a matrix made up of an organic carrier agent 18 and a powder comprising titanium hydride 20 dispersed in the carrier agent 18. The titanium hydride 20 is the single inorganic solid in the titanium hydride layer 16. A titanium hydride layer 16 has a thickness of less than or equal to 10 μm, or preferably from 2 to 8 μm.

The powder particles of the titanium hydride 20 may have a granule size of preferably less than 0.04 mm. With powders of this granule size, a homogenous distribution can be achieved in the carrier agent matrix.

The organic carrier agent 18 preferably comprises a synthetic resin, or especially preferably a physically drying synthetic resin. Especially preferably, the organic carrier agent is a synthetic resin based on chlorinated rubber, polyvinyl chloride (PVC), vinyl polymers, styrene butadiene copolymers, and silicones, or mixtures thereof. More preferably, the organic carrier agent is a PVC synthetic resin.

In order to produce the coated evaporator body, the titanium hydride 20 and the organic carrier agent 18 are suspended in an organic solvent. The solvent is preferably selected from the group of aliphatic ketones, esters, and ethers, the mineral oils, and aromatic hydrocarbons, as well as mixtures thereof. The solvents facilitate the dispersion of the powdery titanium hydride 20 in the organic carrier agent 18.

Especially preferably, the titanium hydride is suspended in a varnish, which contains the organic carrier agent as a binding agent.

The portion of titanium hydride in the suspension comprising solvent, organic carrier agent, and titanium hydride is preferably from 5 to 15% by weight in relation to the total weight of the suspension, or more preferably from 8 to 12% by weight, and especially preferably at about 10% by weight.

The suspension comprising organic carrier agent, titanium hydride, and organic solvent is preferably applied to the evaporator surface 6 in a printing process, or particularly in the so-called pad printing process. In doing so, the suspension is initially held with the assistance of a suction-capable, for example spongy, print body, and the print body is then pressed against the basic body 4 in the area of the evaporator surface 6 such that the thin, maximum 10-μm-thick titanium hydride layer 16 is formed. The suspension in this case has low viscosity in the starting state and practically a watery consistency.

The coating weight of the suspension is preferably about 1 to 5 mg/cm$^2$, or more preferably between about 1 and 3 mg/cm$^2$, and especially preferably from about 2.1 to about 2.5 mg/cm$^2$.

For application in a PVD coating system, the evaporator body 2 is by means of resistance heating heated to a temperature of greater than 1000° C., or preferably to a temperature ranging from 1400 to 1700° C. upon its first use in the coating system. As shown in FIG. 1, upon heating of the evaporator body 2 with a basic body 4 comprising TiB$_2$/BN at the boundary surface to the titanium hydride layer, an intermediate layer 14 comprising TiB$_2$/TiN is formed. The organic carrier agent is decomposed and/or evaporated due to the heating.

In the presence of aluminum, there is a conversion of the aluminum with the titanium hydride with the formation of the wetting layer 12 on the evaporator surface 6 or the intermediate layer 14. The aluminum can be placed on the evaporator surface or added to the heated evaporator body even before heating of the evaporator body.

The coating layer 12 is a titanium/aluminum alloy layer, which contains at least one or more TiAl$_y$ phases. In particular, a TiAl$_3$ phase may be formed.

This wetting layer 12 promotes the initial wetting of the evaporator surface 6 with aluminum. The ability to wet the evaporator surface remains stable when additional aluminum is added. The aluminum melt follows the already existing wetting layer 12 and is distributed homogenously over the entire evaporator surface 6. Merely gradual wear occurs over the service life of the evaporator body 2, which typically comprises several operating hours.

Despite the low layer thickness, the wetting layer 12 exhibits particularly good first-wetting behavior for aluminum, such that a homogenous distribution of the molten aluminum is achieved on the evaporator surface and thus a high rate of evaporation and coating can be achieved. Simultaneously, the homogenous wetting and distribution of the aluminum on the evaporator surface 6 ensures even loading of the basic body 4, because the formation of so-called hotspots are avoided. Such type of hotspots particularly result from the lack of cooling of individual spots on the evaporator surface due to flawed wetting and can lead to premature wear. Finally, the production of the coated evaporator body is easier and more economical, because it is not necessary to use complex combined material mixtures.

The evaporator body according to the invention can thus preferably be used for the metallization of substrates such as flexible plastic films and other bodies made of plastic with aluminum through physical vapor deposition from the gas phase (PVD).

The invention claimed is:

1. A method for producing an evaporator body for a PVD coating system with a basic body and an evaporator surface on the basic body, which comprises the following steps:
   providing a suspension of titanium hydride and an organic carrier agent in an organic solvent; and
   applying the suspension onto the evaporator surface while forming a titanium hydride layer, in which titanium hydride is present as the only inorganic solid;
   wherein the titanium hydride layer is formed in a thickness of no more than 10μ; and heating the evaporator body to melt aluminum in contact with the titanium hydride layer to form a Ti—Al wetting layer.

2. The method according to claim 1, wherein the suspension is applied by means of a print process.

3. The method according to claim 1, wherein the suspension contains titanium hydride in a portion of about 5 to 15% by weight in relation to the total weight of the suspension.

4. The method according to claim 1, wherein the suspension is applied with a coating weight of 1 to 5 mg per cm$^2$ onto the evaporator surface.

5. The method according to claim 1, in which the evaporator body is heated to a temperature greater than 1000° C.

6. The method according to claim 5, wherein the basic body is heated to a temperature ranging from a 1400 to 1700° C.

7. The method according to claim 1, wherein the suspension comprises a varnish.

8. The method according to claim 1, wherein the Ti—Al wetting layer is bonded to the base body via an intermediate layer comprising titanium diboride and titanium nitride.

9. The method according to claim 1, wherein the organic carrier agent comprising a synthetic resin.

10. The method of claim 1, wherein the Ti—Al layer is of formula TiA$_3$.

11. The method of claim 10, wherein the Ti—Al layer further comprises Ti$_x$Al$_y$ phases.

12. The method of claim 1, wherein the thickness of the titanium hydride layer is 2-8 μm.

13. The method of claim 1, wherein the thickness of the titanium hydride layer is 4-6 μm.

* * * * *